United States Patent [19]

Maeder

[11] 4,333,020

[45] Jun. 1, 1982

[54] MOS LATCH CIRCUIT

[75] Inventor: Heinz B. Maeder, Nyon, Switzerland

[73] Assignee: Motorola, Inc., Schaumburg, Ill.

[21] Appl. No.: 41,569

[22] Filed: May 23, 1979

[51] Int. Cl.$^3$ .................... H03K 3/26; H03K 17/28; H03K 5/18; H03K 3/353

[52] U.S. Cl. .................................. 307/279; 307/453; 307/481; 307/291

[58] Field of Search ................... 307/297, 200 B, 481, 307/291, 353, 451, 452, 453, 480, 279

[56] References Cited

U.S. PATENT DOCUMENTS

| | | | |
|---|---|---|---|
| 3,614,476 | 10/1971 | Teranishi | 307/279 |
| 3,748,498 | 7/1973 | Hoffmann | 307/279 |
| 3,935,475 | 1/1976 | Margolies | 307/279 |
| 3,959,781 | 5/1976 | Mehta et al. | 307/279 |
| 4,112,296 | 9/1978 | Heimbigner et al. | 307/279 |
| 4,132,904 | 1/1979 | Harari | 307/297 |
| 4,146,802 | 3/1979 | Moench | 307/200 B |

Primary Examiner—Saxfield Chatmon, Jr.
Attorney, Agent, or Firm—Joe E. Barbee

[57] ABSTRACT

A MOS latch circuit is provided which has a fast response and is sensitive to low level input clock signals. The latch circuit has two load devices which are connected to a pair of cross-coupled transistors. A controllable current source is used to control the current flow through the cross-coupled pair of transistors. A first coupling transistor is connected between the input of the cross-coupled pair of transistors and a second controllable current source. A second coupling transistor is connected between a second input of the cross-coupled pair of transistors and to the second controllable current source. The first and second coupling transistors are enabled by input data signals to the latch circuit while the first and second controllable current sources are controlled by clock signals.

7 Claims, 2 Drawing Figures

MOS LATCH CIRCUIT

This invention relates, in general, to latch circuits, and more particularly, to a MOS latch circuit which can be used in high speed applications.

Latch circuits are widely used in electronic systems. Typically a latch circuit includes a cross-coupled pair of transistors with each having a load device and in some cases the current source for the cross-coupled pair of transistors is a controllable current source. Latch circuits have been used in the past in many applications, such as, input buffers, flip-flops, sense amplifiers, and shift registers. A common problem with latch circuits is that in most applications, such as the ones having controllable current sources, the controllable current source is switched from a full off to a full on operating state. When the current source is switched fully off and then it is desired to be switched on a delay occurs while the control signal exceeds the threshold of the controllable current source. In some cases this delay can be a disadvantage to the circuit.

Accordingly, it is an object of the present invention to provide an improved latch circuit which has a fast response.

Another object of the present invention is to provide a latch circuit which is responsive to low level clock signals.

Yet a further object of the present invention is to provide a latch circuit having two controllable current sources.

SUMMARY OF THE INVENTION

In carrying out the above and other objects and advantages of the present invention, there is provided a latch circuit having two controllable current sources. The latch circuit has a first and a second load device coupled to a pair of cross-coupled field effect transistors. Current flow through the pair of cross-coupled transistors is regulated by a first controllable current source. First and second coupling transistors are connected to the pair of cross-coupled transistors. A second controllable current source is connected to the two coupling transistors to control current flow through the coupling transistor.

The subject matter which is regarded as the invention is set forth in the appended claims. The invention itself, however, together with further objects and advantages thereof, may be better understood by referring to the following detailed description taken in conjunction with the accompanying drawings.

DETAILED DESCRIPTION OF THE DRAWINGS

Figure 1:
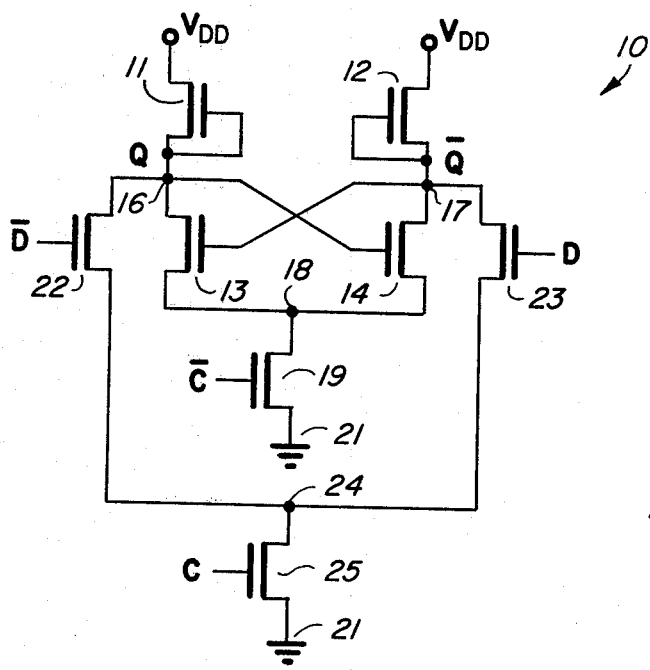
FIG. 1 is a schematic diagram of a latch circuit embodying the present invention.

Latch circuit 10, illustrated in FIG. 1, has depletion type load devices 11 and 12. Load device or load transistor 11 is coupled between voltage terminal $V_{DD}$ and node 16. Depletion device 12 is coupled between voltage terminal $V_{DD}$ and node 17. A cross-coupled pair of transistors 13 and 14 are coupled from nodes 16 and 17 to node 18. Transistor 13 has its gate electrode connected to node 17 and transistor 14 has its gate electrode connected to node 16. Transistor 19 serves as a controllable current source for the basic latch, which includes transistors 11, 12, 13, and 14. Transistor 19 is coupled between node 18 and voltage terminal 21. Voltage terminal 21 provides a reference potential which is illustrated as ground. The gate electrode of transistor 19 receives a clock signal. A coupling transistor 22 is coupled between node 16 and node 24. The gate electrode of transistor 22 receives a data input signal $\overline{D}$. A coupling transistor 23 is coupled between node 17 and node 24. The gate electrode of transistor 23 receives a data input signal D. Transistor 25 which is coupled between node 24 and voltage terminal 21 serves as a second controllable current source. The gate electrode of transistor 25 receives a clock signal C.

In a preferred embodiment clock signal C and $\overline{C}$ are complements of each other and each can have a DC bias which will cause transistors 19 and 25 to operate in their linear region. By transistors 19 and 25 being prebiased to operate in their linear region they will be responsive to low level clock signals.

When clock signal C goes high it will cause transistor 25 to conduct more than transistor 19 and therefore when transistor 22 or 23 is enabled by a $\overline{D}$ or D input signal then node 16 or node 17 will be pulled low. If is assumed that input D goes high, transistor 23 will be enabled thereby causing node 17 to go low. Then when clock signal $\overline{C}$ goes high transistor 19 will be made to conduct heavier and the low at node 17 will cause transistor 13 to conduct less since its gate electrode is connected to node 17. By transistor 13 conducting less node 16 will tend to to high thereby causing transistor 14 to conduct more which will maintain node 17 in a low state; and now, it can be said that transistors 11, 12, 13, and 14 are latched in a state such that node 17 is low and node 16 is high. Node 16 serves as a Q output for the latch and node 17 serves as a $\overline{Q}$ output for the latch. In the preferred embodiment, transistors 13, 14, 19, 22, 23, and 25 are all enhancement type transistors. It should be noted that depletion type transistors 11 and 12 could also be enhancement type transistors, however, then the voltage at node 16 and 17 would be capable of rising to only $V_{DD}$ minus one threshold.

Transistor 19 in FIG. 1 is used to disable the latching effect of latch circuit 10 when clock signal C is high which is during the shifting of data into circuit 10. If transistor 19 were omitted from the circuit then a full MOS level swing would be required on clock signal C to get transistor 25 to conduct enough to overcome the latching action of transistors 13 and 14. By having transistors 19 and 25 prebiased, circuit 10 operates in a current steering mode as opposed to operating in a switching mode. If transistors 19 and 25 were not prebiased then clock drivers would be needed to boost a clock signal into the flip-flop circuits 30-33 in FIG. 2.

Figure 2:
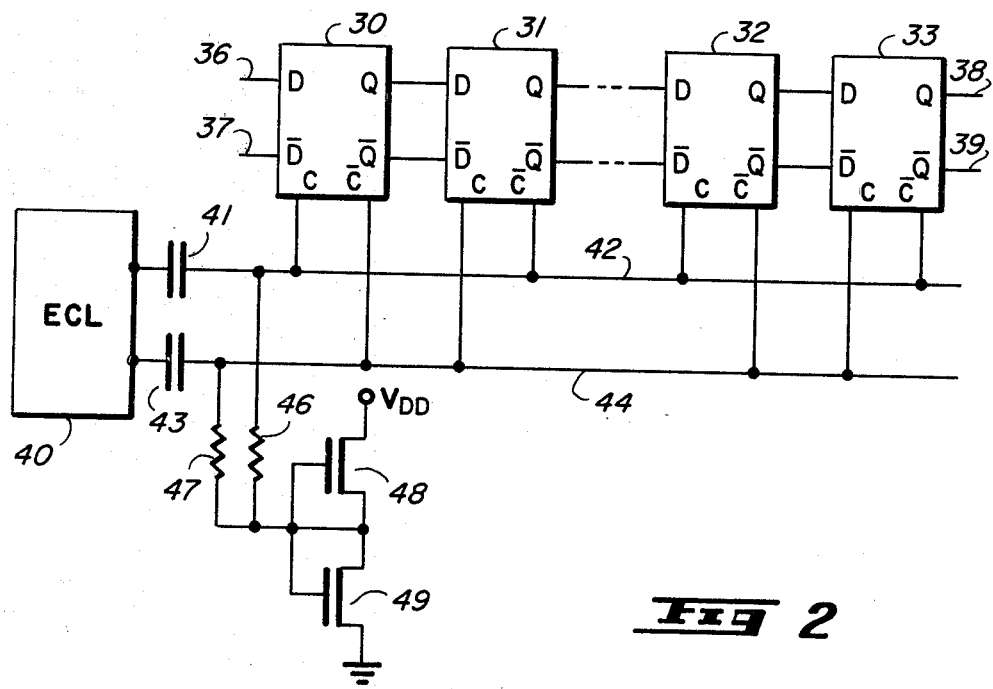
FIG. 2 illustrates in block diagram form a portion of a shift register using the present invention.

FIG. 2 illustrates an application of latch circuit 10, and shows a portion of a shift register having flip-flops 30, 31, 32, and 33. Each of the flip-flops 30-33 consists of the circuitry of FIG. 1. The shift register illustrated in FIG. 2 provides outputs 38 and 39 and these outputs or a combination of the Q and $\overline{Q}$ outputs of the flip-flops 30-33 can be used to generate inputs 36 and 37. Circuit 40 is illustrated as being an emitter coupled logic (ECL) circuit which provides a clock signal output to clock the latches 30-33. Capacitors 41 and 43 couple the output from the ECL circuit 40 to lines 42 and 44, respectively. The signal on line 42 is connected to the clock input C of flip-flops 30 and 32 and to the clock input $\overline{C}$ of flip-flops 31 and 33. The clock signal on line 44 is connected to the clock input $\overline{C}$ of flip-flops 30 and 32 and to the clock input C of flip-flops 31 and 33. The Q output from flip-flop 30 is connected to the D input of flip-flop 31 and the $\overline{Q}$ output from flip-flop 30 is connected to the $\overline{D}$ input of flip-flop 31. Flip-flop 31 has its Q and $\overline{Q}$ outputs coupled to the D and $\overline{D}$ inputs, respectively, of flip-flop 32. The Q and $\overline{Q}$ outputs of flip-flop 32 are connected to the D and $\overline{D}$ inputs, respectively, of flip-flop 33. The Q output of flip-flop 33 appears on line 38 and the $\overline{Q}$ output of flip-flop 33 appears on line 39. The D input for flip-flop 30 appears on line 36 and the $\overline{D}$ input for flip-flop 30 appears on line 37.

As is well known by those persons skilled in the art emitter couple logic circuitry produces an output signal with a swing of approximately 700 mv. In addition the ECL output signal is at some DC level which in most cases is not compatible with MOS bias levels. Accordingly, capacitors 41 and 43 block the ECL bias level but couple the ECL output signal variation. Transistors 48 and 49 are connected in series between voltage terminal VDD and ground and provide a proper bias for input clock signals C and $\overline{C}$. Transistor 48 is a depletion type transistor while transistor 49 is an enhancement type transistor. Transistors 48 and 49 have their gate electrodes connected to a junction formed by the two transistors. The junction formed by the two transistors provides the output bias voltage which is coupled by resistor 46 to line 42 and coupled by resistor 47 to line 44. The biasing circuitry illustrated by transistors 48 and 49 supply the proper bias on lines 42 and 44 to the clock signal lines so that transistors 19 and 25 (FIG. 1) will operate in their linear region. By operating transistors 19 and 25 in their linear region, latch circuit 10 is very sensitive, provides fast respose, and responds to low amplitude clock signals. Note the absence of clock drivers in lines 42 and 44.

I claim:

1. A field effect transistor circuit having a first and a second voltage terminal, and capable of receiving a first and a second input comprising: a first load transistor coupled between the first voltage terminal and a first node; a second load transistor coupled between the first voltage terminal and a second node; a pair of cross-coupled transistors coupled between a third node and the first and second nodes; a first field effect transistor having a first and a second electrode and a gate electrode, the first electrode being coupled to the third node and the second electrode being coupled to the second voltage terminal, and the gate electrode being for receiving a first clock signal; a second field effect transistor coupled between the first node and a fourth node and having a gate electrode for receiving the first input; a third field effect transistor coupled between the second node and the fourth node and having a gate electrode for receiving the second input; and a fourth field effect transistor coupled between the fourth node and the second voltage terminal and having a gate electrode for receiving a second clock signal.

2. The circuit of claim 1 wherein the first and second load transistors are depletion transistors.

3. A latch circuit having a cross-coupled pair of transistors; a first and a second load device coupled to the cross-coupled pair of transistors; a first controllable current source coupled to the cross-coupled pair of transistors; a second controllable current source; and a first and a second input transistor coupled from the cross-coupled pair of transistors to the second controllable current source.

4. A MOS latch circuit having a first and a second voltage terminal, comprising: a first and a second load device, the first load device being coupled between a first node and the first voltage terminal, the second load device being coupled between a second node and the first voltage terminal; a pair of cross-coupled transistors coupled between a third node and the first and second nodes; a first controllable current source coupled between the third node and the second voltage terminal; a second controllable current source coupled between a fourth node and the second voltage terminal; a first coupling transistor having a first and second electrode and a gate electrode, the first electrode being coupled to the first node and the second electrode being coupled to the fourth node, and the gate electrode being coupled to a first input, and a second coupling transistor having a first and a second electrode and a gate electrode, the first electrode of the second coupling transistor being coupled to the second node, the second electrode of the second coupling transistor being coupled to the fourth node, and the gate electrode of the second coupling transistor being coupled to a second input.

5. The MOS latch circuit of claim 4 wherein the first and second controllable current sources are field effect transistors each having a gate electrode coupled to a first and a second clock input, respectively.

6. The MOS latch circuit of claim 5 wherein the first and second load devices are field effect transistors.

7. The MOS latch circuit of claim 4 wherein the first and second controllable current sources are operated in their linear operating region.

* * * * *